United States Patent [19]

Benkowski et al.

[11] Patent Number: 5,437,760
[45] Date of Patent: Aug. 1, 1995

[54] PRESS BELT APPLICATOR FOR A CONTINUOUS BELT PRESS

[75] Inventors: Frank J. Benkowski, New Philadelphia; Morris Cordova, Newark, both of Ohio; E. Scott DelliGatti, Clifton Park, N.Y.; Timothy A. Holder, Coshocton, Ohio

[73] Assignee: General Electric Company, Coshocton, Ohio

[21] Appl. No.: 120,889

[22] Filed: Sep. 13, 1993

[51] Int. Cl.6 .......................................... B65G 45/10
[52] U.S. Cl. ................. 156/580; 156/281; 118/70; 118/203; 15/256.52
[58] Field of Search ............ 156/281, 324, 498, 555, 156/580, 583.5; 100/151, 154, 102; 425/371; 15/256.51, 256.52; 118/70, 203; 198/495

[56] References Cited

U.S. PATENT DOCUMENTS

| | | | |
|---|---|---|---|
| 2,868,162 | 1/1959 | Knain | 118/219 |
| 3,106,480 | 10/1963 | Baker | 427/286 |
| 3,716,019 | 2/1973 | Carter et al. | 118/246 |
| 4,344,361 | 8/1982 | MacPhee et al. | 15/256.51 X |
| 4,457,683 | 7/1984 | Gerhardt et al. | 425/373 |
| 4,599,128 | 7/1986 | Held | 156/583.5 X |
| 4,613,293 | 9/1986 | Gerhardt | 425/371 |
| 4,621,999 | 11/1986 | Gerhardt | 425/371 |
| 4,726,871 | 2/1988 | Hüsges et al. | 156/389 |
| 4,755,252 | 7/1988 | Held | 100/102 X |
| 4,852,209 | 8/1989 | Svenka et al. | 15/256.52 X |
| 4,923,384 | 5/1990 | Gerhardt | 425/371 |
| 4,966,642 | 10/1990 | Zitzmann | 156/164 |
| 5,147,028 | 9/1992 | Raggi | 15/256.51 X |

FOREIGN PATENT DOCUMENTS

| | | |
|---|---|---|
| 0096863 | 12/1983 | European Pat. Off. . |
| 0142925 | 5/1985 | European Pat. Off. . |
| 0480897 | 4/1992 | European Pat. Off. . |
| 2346824 | 3/1975 | Germany . |
| 3821025 | 12/1989 | Germany . |
| 61-046276 | 3/1986 | Japan . |
| 02063834 | 3/1990 | Japan . |
| 4269516 | 9/1992 | Japan . |
| 5096219 | 4/1993 | Japan . |

Primary Examiner—David A. Simmons
Assistant Examiner—J. Sells

[57] ABSTRACT

The present invention provides a fluid applicator system, which can be used to apply or remove fluids from the press belts associated with a continuous belt press. The present invention provides for applying a uniformly thick layer of fluid to a press belt with one or more rollers, and the use of those or other rollers to remove liquid from a press belt. The applicator system of the present invention can be self-cleaning, and the rollers temperature regulated to facilitate the application and removal of liquids. The present invention also provides a ventilation system for removing any dangerous vapors.

7 Claims, 7 Drawing Sheets

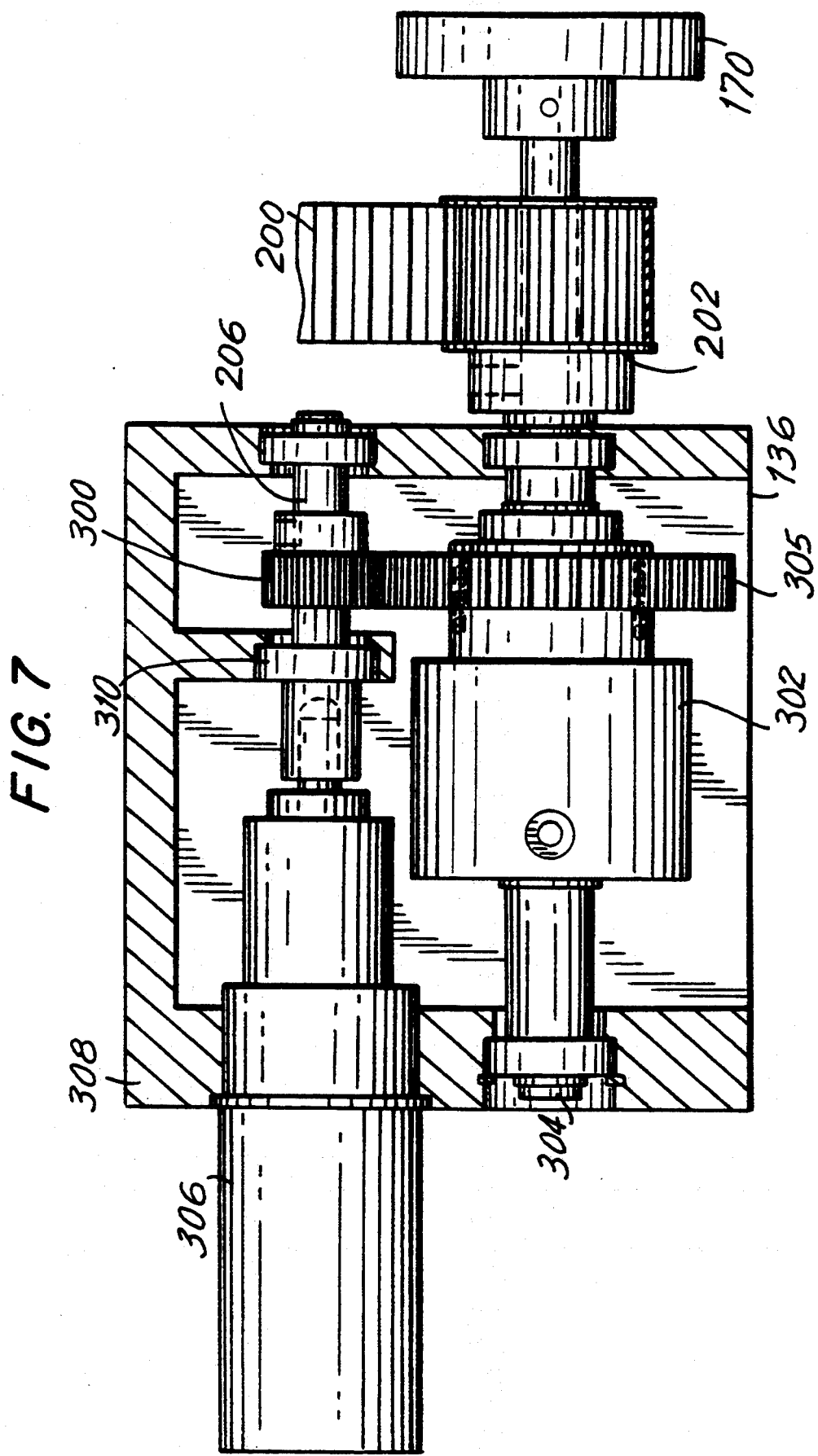

PRESS BELT APPLICATOR FOR A CONTINUOUS BELT PRESS

BACKGROUND OF THE INVENTION

Belt-type presses for making particleboard, fiberboard, copper clad boards for printed circuit boards and the like are known in the prior art related to the invention. The materials being pressed (known as press materials or press products) can include laminates, rubber products, particleboard, plastics and any other products formed by pressing multiple layers together. Generally, belt presses comprise an endless upper press belt, often a steel press belt, circulated over spaced-apart guide belt rollers, and a corresponding endless lower press belt, also often a steel press belt, circulated over spaced-apart guide belt rollers as well. Between them, these press belts form a pressing gap or pressing region of the belt-type press, between the press framework having upper and lower platens. The upper and lower belts each have their own drive mechanisms. In a known press of this type, two chains are associated with each of the press platens and press belts, or a total of four chains per belt press system. The upper and lower platens form an entrance region along a complete horizontal plane.

Into the pressing region between the platens and their corresponding press belts, the spaced apart rollers are fed and guided along a circulation path with the aid of upper and lower roller circulation mechanisms. The roller circulation mechanisms comprise upper and lower chain sets, where each set is driven by a chain drive sprocket. The chain sets, in turn, circulate or drive the rollers so that the rollers move along with the press belts, situated between their respective belts and the platens. Guide rails are used to channel the movement of the chain sets and rollers in the intended direction. Thus, the upper press mechanism has two chains with rollers disposed across the width of the press between both chains, and the lower press mechanism has two corresponding chains with rollers disposed between them as well.

In many cases, the upper and lower platens are heated. The rollers are situated between the steel press belts and the heated platens. The rollers are equally spaced apart and roll more or less along with the belt. As press material is inserted into the entrance of the pressing region (or press gap entrance), the steel press belts are contacted by the press products on one side and the rollers on the other. In turn, the rollers contact the press belts and the heated platens, thus acting to transfer heat from the platens to the steel belts. The heat is ultimately transferred from the platen to the steel press belt via the rollers. Finally, the heat is transferred from the steel press belt to the press material.

For the circulation of rolling rods to the press gap entrance, the rolling rods are channeled along guide rails and links cooperating with sliding wheels and guide wheels. Both sets of chains, that is, the upper and lower chain sets, are driven individually by chain drive motors. Each motor is connected to a chain drive axis, which has chain drive sprockets disposed at its ends. The upper and lower chain drive systems, however, are not connected mechanically because the belt press is specifically designed to open. That is, the upper and lower belt press mechanisms form a "C", with the upper belt press as the top half of the "C", and the lower belt press as the bottom half. In this manner, the belt press system can easily be maintained, and all moving parts are freely accessible to the operator or maintenance personnel.

During the manufacture of complex multilayer press products, the upper and lower press belts are in constant contact with a multiplicity of various materials. When single side clad composite materials are made, the unclad side must be coated with a release film or chemical, so that it will not adhere to the press belt. The clad side may or may not require a release agent. For example, if laminates for electronic circuit boards are being fabricated, copper cladding may be required on one or both sides of the laminate (or not at all). A release agent may then be used to prevent an unclad surface from sticking to a pressing surface, such as a press belt. In this application, the clad side would not normally require a release agent. Because various materials are being pressed at different times, it has been a problem in the art to insure the purity of the materials being applied to the press belts at any given instant in time. This problem stems from the fact that cleaning the press belts between the applications of different chemicals can be time consuming, and at times virtually impossible.

The problem is prevalent in any manufacturing process where the pressed material or laminates have several diverse layers. For example, one layer deposited may entail using certain chemicals not compatible with those used for depositing other subsequent layers. In such a case, the diverse chemicals may react adversely. In order to prevent impurities (which could render subsequent coatings useless), it is necessary to completely clean off the press belts between steps involving the application of different liquids. However, it is very time consuming to clean the press belts, and a need exists for effective and efficient belt cleaning.

Many problems also result from trying to uniformly apply liquids to press belts. Because the belts (often made of steel) are substantially rigid, it is necessary to have an applicator (and cleaner) roller capable of uniformly contacting the steel belt at all times. In this manner, a uniform layer of laminating material can be applied to the object being pressed, and in the context of cleaning, the belt can be completely scraped clean. If a residue of previous, incompatible chemicals (contaminates) are left on the belt, defects or impurities in the press products can result. Also, when applying liquids to the press belt, it may be necessary to adjust the temperature (often to cool it off) of the liquid being applied.

Other problems result from conventional applicators. Because the belts are to some degree porous, the fluids need to be worked into the belts. Also, combustible fluids are often used, and proper ventilation is very important. In addition, because applicator rollers themselves become contaminated with the various fluids, there exists a need in the art to have a mechanism that cleans not only the press belt but the applicator rollers themselves, and to be able to clean the applicator rollers even if the applicator rollers are disengaged from their press belts. If not, the contaminates would merely be transported back and forth between the press belt and the applicator roller.

SUMMARY OF THE INVENTION

These objects and others which will become more apparent hereinafter are attained in accordance with the invention in a belt-type press for making particleboard, fiberboard, copper clad laminates for printed circuit boards, pressedboard, laminates, and the like comprising endless upper and lower press belts, preferably steel press belts, circulated over upper and lower belt guide rollers. These upper and lower press belts are positioned to form a pressing gap between the upper and lower press belts in a pressing region, and the press framework has upper and lower platens as well as upper and lower roller chain drive mechanisms.

A plurality of rolling rods spaced apart from each other are fed into the pressing region between each of the platens and its corresponding press belt. The rollers are guided with a chain and guide circulating mechanism, wherein each roller is fastened at its ends between first and second chains, and each chain set is guided over at least one sprocket driven by a chain drive motor. Guide rails control the movement of the roller drive chains.

At the press gap entrance, the rollers are continuously circulating between the platens and press belts. The platens, press belts and rollers are commonly made of steel. The chains used to drive the rollers are known as roller drive chains. The roller drive chains are driven by chain drive sprockets, which are connected to the ends of chain drive axles. The chain drive axles are connected to chain drive motors, which drive the entire chain drive mechanism. Both the upper and lower presses have a set of rollers and chains, and both the upper and lower presses have their own chain drive motors.

The present invention can be used in belt presses using rollers (for example, the conti-roll type) or those that do not use rollers (which can, for example, employ a pressurized fluid bed chamber design), and can be positioned anywhere. For example, the applicator of the present invention can be positioned adjacent to or at the outlet or inlet drums associated with belt presses. According to the present invention, a press belt applicator is used to apply a uniform film of fluid to a press belt or any other surface to be coated, at any temperature. A chill roller in contact with the applicator roller, for example, can be used in the present invention to adjust the temperature of the liquid being applied to the press belt. The various applied fluids are worked into the surfaces of the press belts, so that the press belts can transfer a uniform layer of the fluid to the press material, for example, printed circuit boards, being pressed. For example, the applicator according to the present invention can be used to apply a chemical agent to steel press belts which react with Fe molecules to form a reaction film coating in the pores and surface of the belts. This reaction film coating can be applied as needed. The applicator can also be used to cure and clean the belts as needed, or to otherwise remove contaminates, especially where either release sheets or release agents are used to permit the pressed material to be separated from the press belts.

In addition, it is another feature of the present invention to remove fluid vapors, which can be highly combustible, toxic or otherwise harmful. Also, the applicator roller of the present invention can be equipped with or used as a cleaning mechanism. That is, the applicator roller can be used to clean the press belts, and also, the applicator roller system is equipped with a self-cleaning feature so that various fluids can be eliminated from the applicator roller and the press belt before subsequent processing steps are carried out. This is accomplished by using a drive mechanism to clean the applicator roller while it is disengaged from the press belt. Finally, it is an aspect of the present invention that fluids can be applied to or removed from the press belts at any speed, and that the applicator roller can be power assisted, and run at a speed independent of the speed of the press belt.

BRIEF DESCRIPTION OF THE DRAWINGS

FIG. 4A is a detailed diagram of a removal system.

FIG. 7 is a cross-sectional view 7—7 taken from FIG. 5.

DETAILED DESCRIPTION OF THE PREFERRED EMBODIMENT

Figure 1:
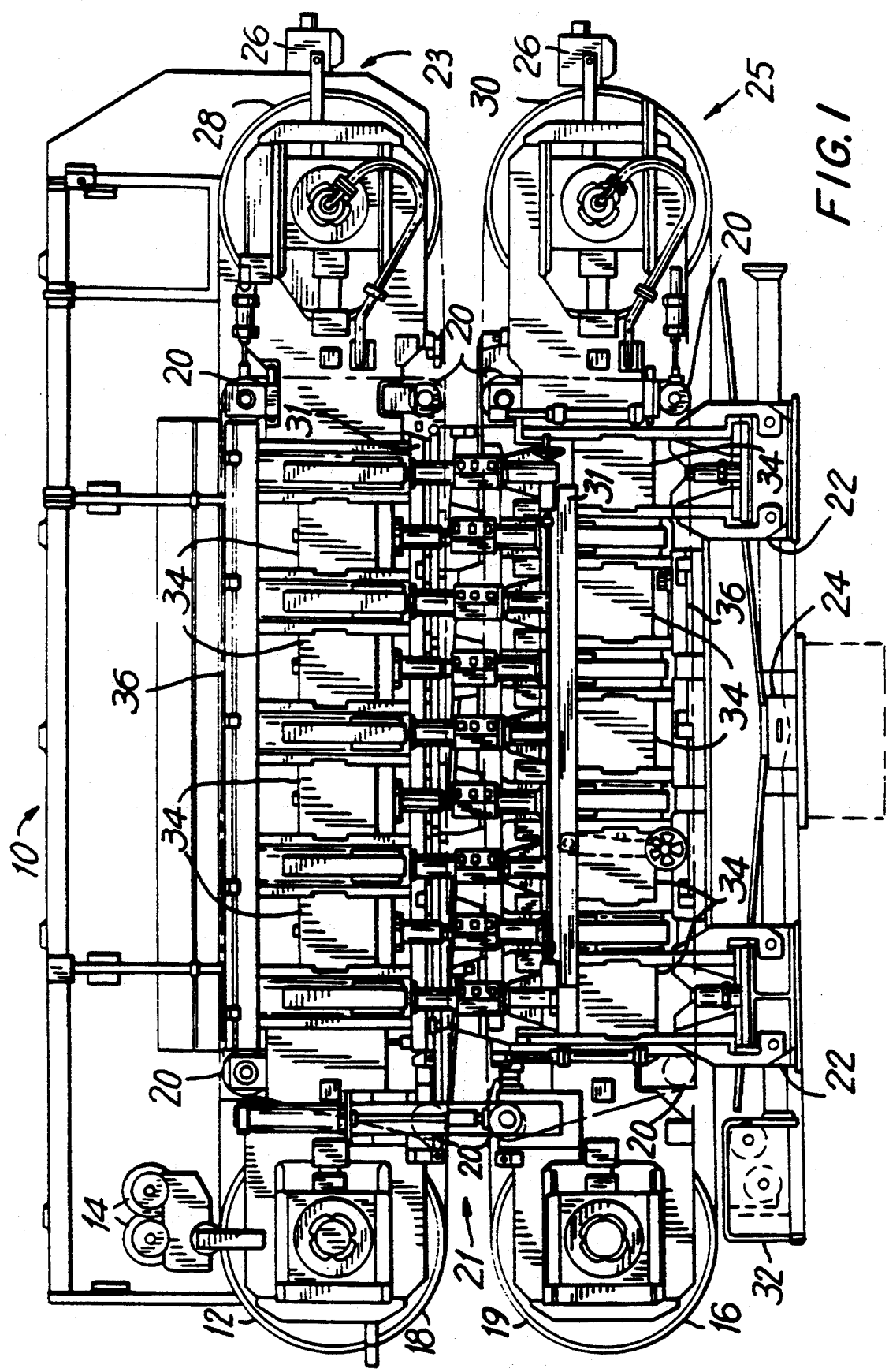
FIG. 1 is a side view of a continuous belt press system.

FIG. 1 is a side view of a continuous belt press system 10. Top exit drum 28 is driven counterclockwise and bottom exit drum 30 is driven clockwise, so that press belts 18 and are driven through the press gap 21. In turn, top entry drum 12 and bottom entry drum 16 rotate along with press belts and 19. Typically, only exit drums 28 and 30 are actually motor driven, while entry drums 12 and 16 are in turn driven by their corresponding belts. Importantly, the upper press assembly 23 and the lower press assembly 25 have press belts 18 and 19 respectively that are independently driven. In this manner, the upper and lower press assemblies can be separated, that is, for example, the upper press assembly 23 can be raised without being confined by any mechanical connections to the lower press assembly 25.

The upper press assembly 23 is raised away from the lower press assembly 25 by the activation of belt press open/close cylinder assemblies 34, which are located out of the way, to the sides of press belts 18 and 19. In the manufacture of laminates, for example, the fabrication of copper clad laminates for printed circuit boards, press belts 18 and 19 compress material (press material) which is inserted into the press gap 21. Belt wiper units 14 and 32 are used to clean off the press belts, e.g., to remove dust and dirt that can interfere with the manufacturing process from the belts. The wiper units may incorporate the use of fabric to wipe off the belts. Excess fluids (e.g., lubricants) are collected below the belt press system 10 in fluid pan 24.

The upper belt system 23 is connected to the lower belt system 25 by a series of hinges and support structures, well known in the art. The lower belt system 25 is supported by support fixtures 22. The upper and lower press belt systems 23 and 25 nearly meet, so that a press gap 21 is formed between upper press belt 18 and lower press belt 19. Friction is applied to press materials entering the press gap 21 by the upper press belt 18 supported by upper platen 31, and by the lower press belt 19 supported by lower platen 31. Both of these platens 31, often made of steel, can be heated as desired. A series of rollers 62 (also often made of steel and shown at FIG. 2) driven by a chain 48 are sandwiched between the upper and lower press belts 18 and 19 and their respective platens. These rollers 62 support the belts and facilitate their movement along the length of the continuous belt press 10, and also serve to transfer heat from the platens 31 to the belts 18 and 19. The belts, rollers and platens can be composed of any material desired, but often, they are all made of steel. In this manner, the rollers 62 transfer heat from the platens 31 to the belts 18 and 19. When belts 18 and 19 are also made of steel or other thermally conductive materials, the heat of platen 31 is transferred to the press material being inserted into the press gap 21.

Chain guide 36 is used to guide the upper roller timing chain 48 so that the chain does not become entangles in various moving parts. A corresponding chain guide is also used to guide the lower roller timing chain. Applicator systems 26 apply a uniform liquid coating to belts 18 and 19. Also, applicator systems 26 can be used to clean or remove liquids from belts 18 and 19. Both modes of operation are possible because one or more rollers are contained within systems 26, and the rollers can roll along with belts 18 and 19, or can be fixed, so that the rollers act as a "squeegee" against the belts, thus cleaning them. Applicator systems 26 can also be self-cleaning, where the rollers contained within clean each other. That is, a solvent can be introduced into the applicator system 26, and the rollers can be rotated (while not in contact with the belts) until the rollers are clean and free of any liquids that were previously applied to the belts. The rollers may also be temperature regulated (i.e., heated or cooled), so that fluid application and cleaning procedures are optimized. Finally, the rollers contained within the systems 26 can be driven contact with belts 18 and 19, manually (by hand), or by discrete motors directly linked to the rollers. Actuators, well known in the art, are used to control the positions of all rollers within the applicator system 26 (i.e., with respect to each other and with respect to the belts 18 and 19), as set forth in greater detail below.

Figure 2:
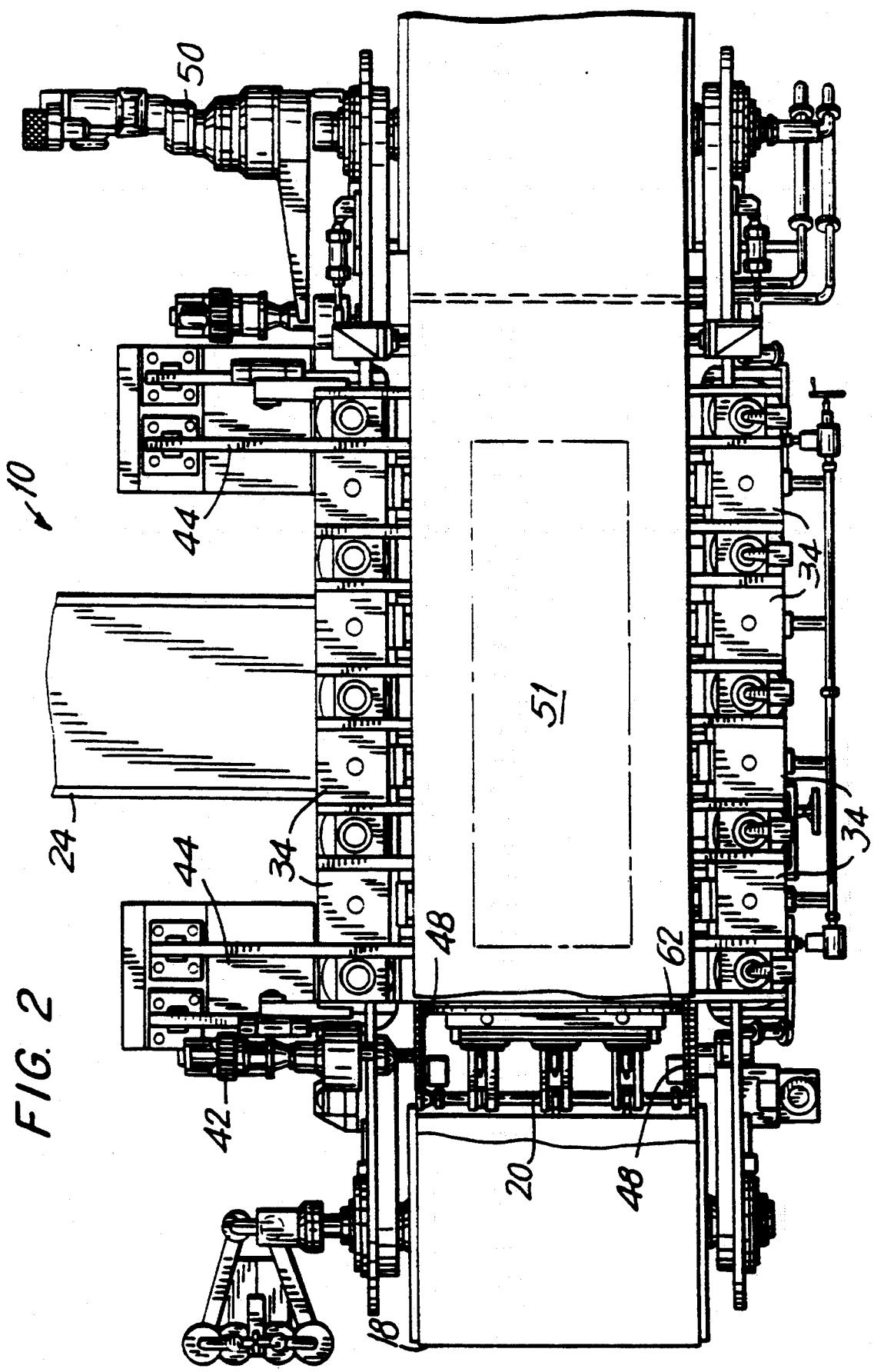
FIG. 2 is a top view of a continuous belt press system.

FIG. 2 is a top view of a continuous belt press system 10, which shows in greater detail the chain drive system used for the upper press belt system 23. Similar or identical apparatus is also associated with the lower press belt system 25. Mechanism 42 drives the chain drive axis 20 (shown in FIG. 1), which drives sprockets which mate with roller timing chain 48. Thus, two roller timing chains 48 are associated with both the upper and lower press belt system. The top press belt system 23 is supported by top belt press supports 44. Belt press open/close cylinders 34 are activated to raise the upper press belt system 23. Press belt 18 is driven by belt drive mechanism 50. The roller timing chains 48 (two used for the upper press belt system 23 and two used for the lower press belt system 25) are connected to both ends of a series of rollers 62, and cause these rollers 62 to move along with and support the press belts 18 and 19.

Figure 3:
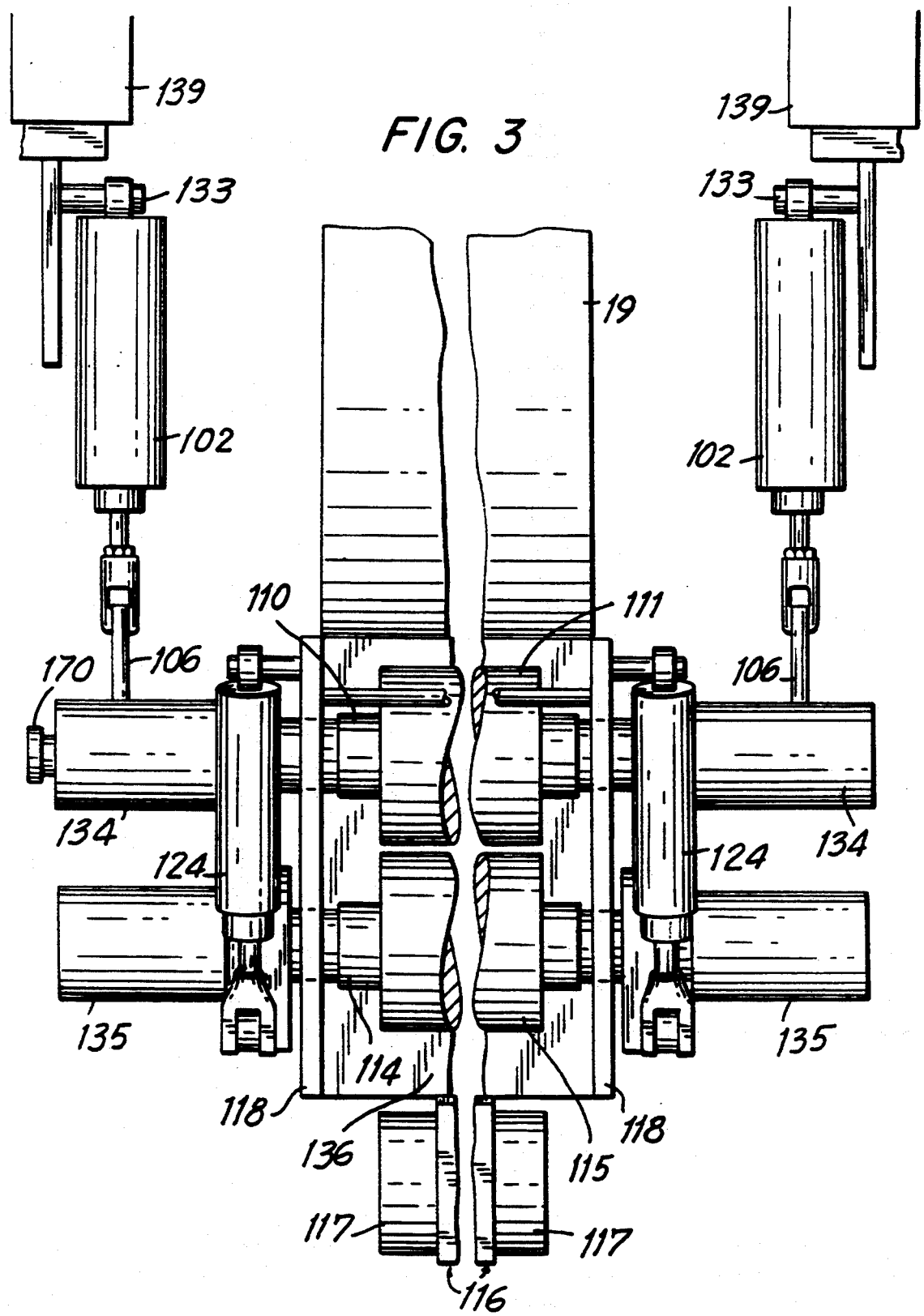
FIG. 3 is a top view of a single applicator roller system as connected to a belt press.
Figure 4:
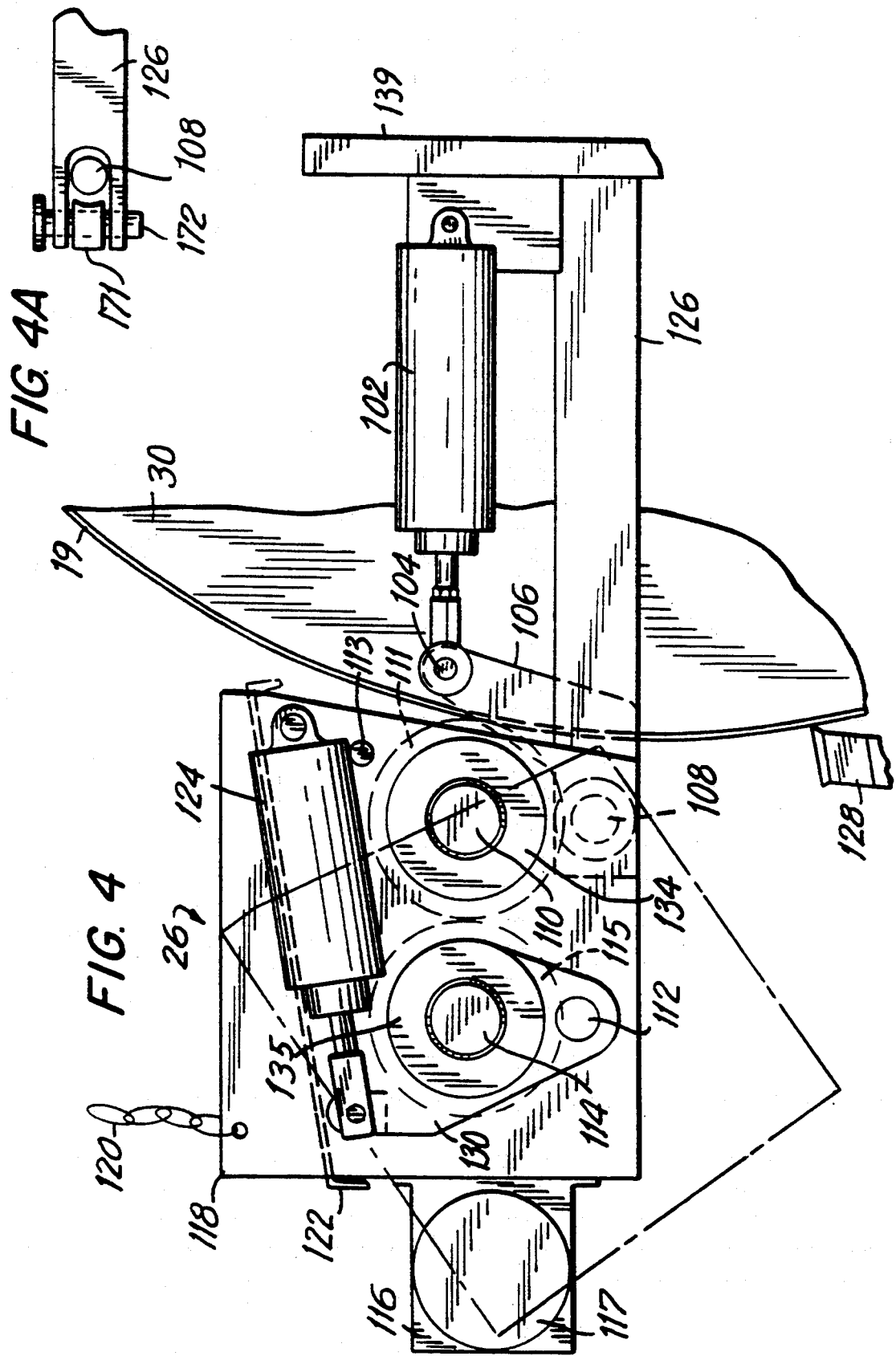
FIG. 4 is a side view of a single applicator roller system as connected to a belt press.

FIG. 3 is a top view of the applicator system 26, and FIG. 4 is a right side view of the same system. The applicator system 26 is pulled up against the press belt 19 by actuator cylinder 102. Actuator 102 is fastened to the exit drum bearing housing 139 by pivot pin 133. Actuator 102 is connected to applicator system 26 by pivot pin and clevis 104 (shown in FIG. 4) and ear 106, which is typically welded on to the housing of the applicator system 26. Ear 106 is attached to the pivot shaft 108 and rotates about the center of shaft 108, as shown in FIG. 4. Applicator system 26 has a feature that enables its easy removal, provided by pin 172 and keeper 171, which retain pivot shaft 108 within rigid member 126. This feature for easy removal is shown in detail in FIG. 4A, and the rigid member 126 is shown in FIG. 4.

As shown in FIG. 4, the applicator system 26 can be set in one of two positions: engaged against press belt 19 (which is shown wrapped around the lower exit drum 30) and disengaged. Within applicator system 26, applicator roller 111 contacts press belt 19 to apply a uniform film of liquid to the press belt 19. Fluids to be applied to the press belt 19 or solvents to clean the applicator system 26 or the press belt 19 are supplied to the applicator system 26 by way of distribution tube outlet 113. Thus, as roller 111 revolves about hub 110, it can apply a uniform film of liquid to press belt 19. Applicator roller 111 is also in contact with chill roller 115, which revolves about hub 114. The chill roller 115 serves several purposes which are primary advantages of the present invention. First, the chill roller 115 can be refrigerated (or heated, if desirable), to cool the liquid contained within the applicator system 26. Secondly, chill roller actuator 124, which is connected to the chill roller 115 by way of chill roller crank 130 (which pivots about pin 112), can pull the chill roller 115 up against the applicator roller 111, either for cooling the applicator roller 111 while it is engaged against the press belt 19, or for cleaning the applicator roller 111 while it is disengaged. That is, the applicator roller 111 can be driven (i) independently by a motor drive 306 (shown in FIG. 7), or (ii) by continuous contact with press belt 19, or (iii) by manual rotation of handwheel 170. Conversely, chill roller 115 is not typically driven by a motor, but is usually driven by contact with applicator roller 111. This is the case when, for example, roller 111 is powered by press belt contact or through motor drive chains.

Chill roller 115 can also be used to clean the applicator roller 111 while it is disengaged from the press belt 19. In this case, i.e., in the self-cleaning mode, a solvent liquid is supplied to the applicator system 26 via tube 113. As shown in FIGS. 3 and 4, the applicator system 26 is vented by air exhaust duct 116 through openings 117, which removes possibly toxic, combustible or otherwise harmful vapors associated with the liquids supplied to the applicator roller 111. A cover 122 (shown in FIG. 4) is kept over the applicator system 26 to also assist in containing the vapors within the cavity of the applicator system. A side plate weldment 118 and mounting frame 126 provide the necessary support for the applicator system 26, and safety chain 120 provides additional security. Wiper 128 is part of a typical contiroll press belt system, and is used to remove oil from the belt edges. Its position also allows it to be used to remove excess overflow from roller 111 when in contact with the press belts. The trough 136 (shown in FIGS. 3, 7 and 7) formed by sides 118 and the remainder of the shell member has provision for collecting and draining excessive fluids collected during processing.

The shell members between sides 118 and rotary joints 134 and 135 (shown in FIG. 3) are used to provide cooling fluid to the interior surfaces of applicator roller 111 and chill roller 115. Fluid can be channelled through the applicator systems with, for example, multiple pathways in series or parallel. Ear 106, attached to the pivot shaft 108 which pivots upon rigid member 126, allows the applicator system 26 to engage or disengage from contact with press belt 19 through the activation of actuators 102. Distribution tube 113 has any number of flow orifices across its length in order to provide fluid distribution across the length of roller 111. Fluid is supplied on one or both ends of tube depending on the fluid distribution across its length. Fluids are typically supplied by a low pressure fluid pump, not shown. Excessive fluid pooling and/or lack of fluid in areas are counter productive to application.

Figure 5:
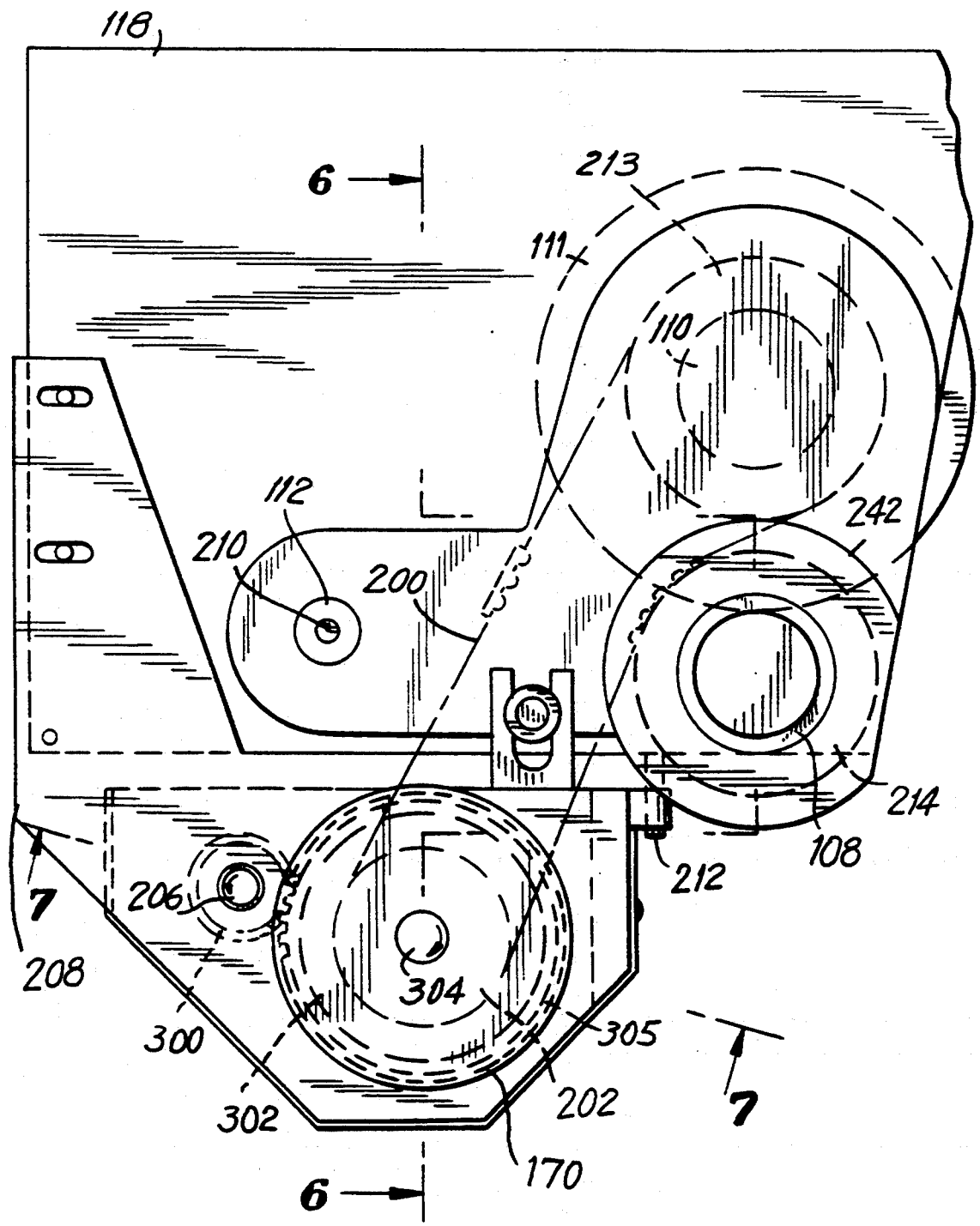
FIG. 5 is a detailed diagram of an applicator roller system.
Figure 6:
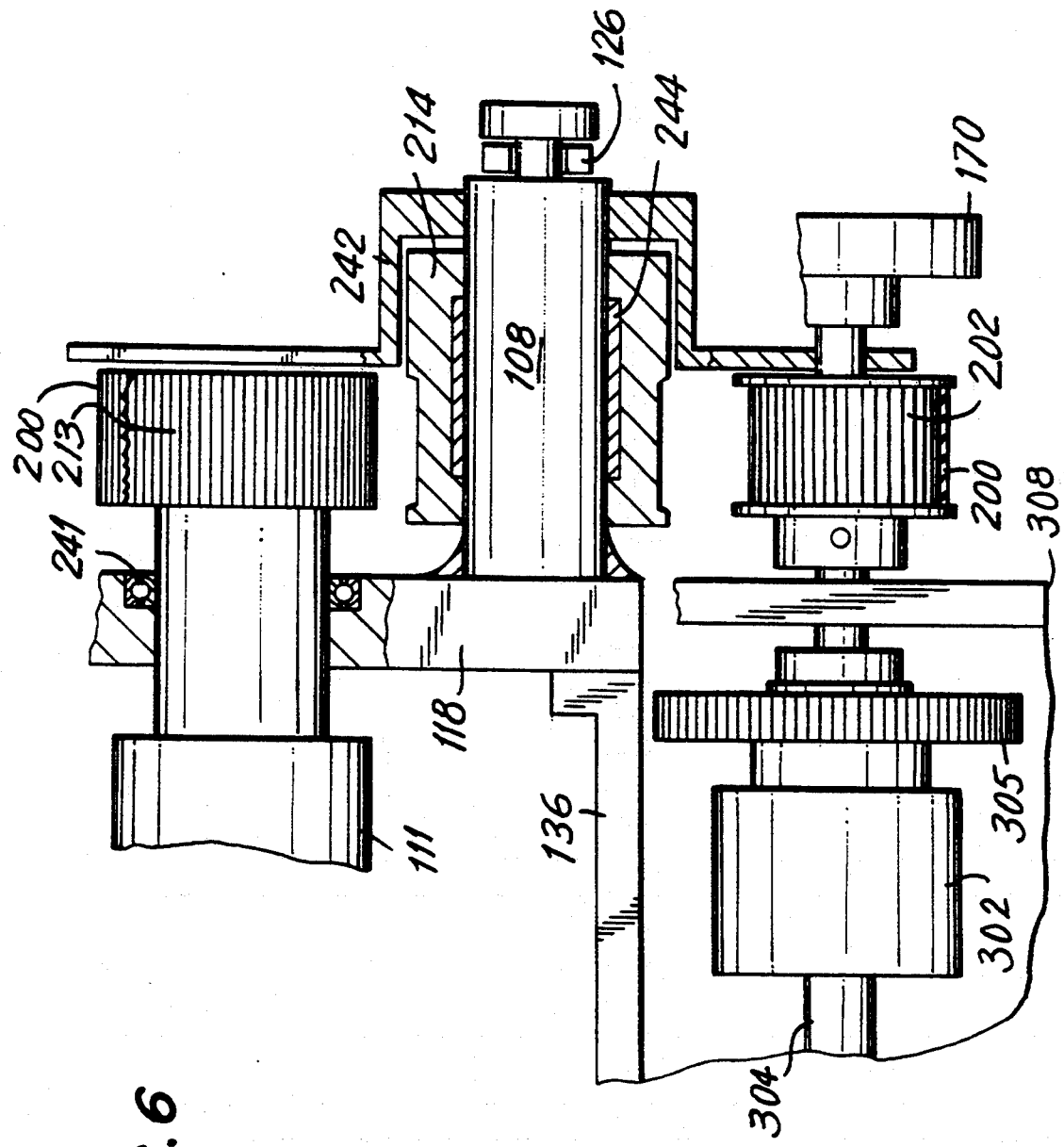
FIG. 6 is a cross-sectional view 6—6 taken from FIG. 5.

FIG. 5 is a detailed diagram of an applicator roller system 26, consisting principally of the pivot shaft 108, belt drive pulley 202, gear box input shaft 206, gear box frame 208, drive belt 200, applicator roller 111 and jack screw 212. Applicator roller 111, in the motor powered mode, is driven by pulley 213, belt 200 and driver pulley 202. Idler pulley 214 has a bearing 244 associated with it which rotates upon shaft 108, which is part of side plate weldment 118, as shown in FIG. 6. Roller 111 is powered by drive motor 306 (shown in FIG. 7) through transmission assembly and pulley 202. Transmission assembly mounting plate 208 attaches to side plate 118 by fasteners. Provision for belt tensioning is obtained through jack screw 212. Advancing jack screw 212 pushes the transmission assembly side plate 208 and thereby increasing belt tension. Fasteners are tightened to maintain position. Finally, pivot 112 is fastened to and rotates about pin 210.

FIG. 6 is a cross-sectional view 6—6 taken from FIG. 5. Section view 6—6 shows power transfer from the drive motor through shaft 304 to belt 200, or manual power input through handwheel 170. Torque in handwheel 170 develops tension in belt 200 causing pulley 213 to rotate. Pulley 213 is mounted upon roller 111. Roller 111 has anti-friction bearings 241 in side plates 118. Pivot shaft 108 which is part of side frame 118 acts as pivot for bracket 126 and as shaft for idler pulley 214 and its bearing insert 244. The pulleys and the belt are covered by guard 242. The parts are packaged in a confined space to conserve available room on press mounting and provide access space for operators. The configuration could be different if more space were available.

FIG. 7 is a cross-sectional view 7—7 taken from FIG. 5. FIG. 7 shows the assembly of the drive system, consisting of drive motor 306 mounted in gearbox and frame work 308. The drive motor is coupled to drive shaft 206 (shown as well in FIG. 5) and has bearings 310 and gear 300. Driver shaft 304 has mounted to it a clutch assembly 302 which when engaged transmits power from gear 300 through driver gear 305. Gear 305 is mounted in input portion of clutch assembly. The clutch assembly is air actuated in this case due to vapors present. Engagement of clutch connects gear 305 to shaft 304 which then powers pulley 202 and belt 200. Bearings mount shaft 304 in gear box and framework 308. Handwheel 170 is attached to shaft 304 and when clutch is disengaged, manual rotation of applicator roll is possible for servicing, clean-up, etc.

It is further contemplated that after having read the preceding disclosure, other alterations and modifications of the present invention will become apparent to those skilled in the art. It is intended that the following claims be interpreted to cover all such obvious alterations and modifications.

We claim:

1. A continuous press belt system for the manufacture of metal laminates a comprising:
    first and second press belts, said first and second press belts being supported for the formation of a press gap between said press belts,
    first and a second platen, each platen being operably associated with a respective press belt for applying pressure to material within said press gap;
    first and second applicator system, each applicator system being removably mounted to said continuous belt system for applying a coating of fluid to a respective belt;
    each applicator system comprising an applicator roller, a fluid outlet means for providing fluid to said applicator roller such that said fluid is applied by said applicator roller onto said press belt, a chill roller removably in contact with said applicator roller for controlling the temperature of the fluid applied to said applicator roller, a first actuator means for positioning said applicator roller into and out of contact with a respective belt, and a second actuator means for positioning said chill roller into and out of contact with a respective applicator roller.

2. A continuous press belt system for the manufacture of metal laminates according to claim 1 comprising a frame for supporting said first and second press belts, a pair of rigid members fixedly mounted to said frame, said first and said second applicator systems being removably mounted to a respective frame.

3. A continuous press belt system for the manufacture of metal laminates according to claim 2 wherein said removable mounting of each of said rigid member and said frame comprises a pin and pivot shaft.

4. A continuous press belt system for the manufacture of metal laminates according to claim 1 wherein said chill roller further comprises refrigeration means.

5. A continuous press belt system for the manufacture of metal laminates according to claim 1 wherein said fluid is a solvent used for cleaning said belt.

6. A continuous press belt system for the manufacture of metal laminates according to claim 1 wherein each of said applicator rollers is coupled to a respective drive mechanism for causing said chill roller to roll.

7. A continuous press belt system for the manufacture of metal laminates according to claim 1 wherein each applicator system comprises a ventilation means for removing fumes associated with said fluid.

* * * * *